United States Patent [19]

Takagi et al.

[11] Patent Number: 5,521,054
[45] Date of Patent: May 28, 1996

[54] DEVELOPING SOLUTION COMPRISING AN AROMATIC HYDROCARBON, AN ALCOHOL, AND AN ESTER

[75] Inventors: Toshiya Takagi; Hiroshi Komano, both of Kanagawa, Japan

[73] Assignee: Tokyo Ohka Kogyo Co., Ltd., Kanagawa, Japan

[21] Appl. No.: 265,338

[22] Filed: Jun. 24, 1994

[30] Foreign Application Priority Data

Jun. 25, 1993 [JP] Japan .................................... 5-177636

[51] Int. Cl.$^6$ .............................. G03C 5/00; G03F 7/00; G03D 9/00
[52] U.S. Cl. ........................ 430/331; 430/309; 252/170; 252/DIG. 8
[58] Field of Search .................................... 430/331, 306, 430/309, 325, 326, 338; 252/170, DIG. 8

[56] References Cited

U.S. PATENT DOCUMENTS

| | | |
|---|---|---|
| 4,045,231 | 8/1977 | Toda et al. . |
| 5,128,234 | 7/1992 | Telser .................................... 430/331 X |
| 5,185,235 | 2/1993 | Sato et al. .............................. 430/331 |

FOREIGN PATENT DOCUMENTS

| | | |
|---|---|---|
| 418564 | 1/1992 | Japan . |
| 1366769 | 9/1974 | United Kingdom . |

OTHER PUBLICATIONS

Specification of USSN 07/967/696.

*Primary Examiner*—George F. Lesmes
*Assistant Examiner*—Bernard P. Codd

*Attorney, Agent, or Firm*—Sughrue, Mion, Zinn, Macpeak & Seas

[57] ABSTRACT

A developing solution comprising (A) at least one aromatic hydrocarbon having a boiling point of from 150° to 300° C.; (B) at least one alcohol represented by the following formula (I):

$$R^1OH \qquad (I)$$

wherein $R^1$ represents an aliphatic or alicyclic alkyl group having from 5 to 12 carbon atoms, $-C_nH_{2n}Ar$, $-(C_mH_{2m}O)_pC_qH_{2q+1}$, a furfuryl group or a hydrogenated furfuryl group, an alkyl group substituted by an acyl group or an epoxy group, or $-CH_2CH_2(OCH_2CH_2)_rOR^2$; in which Ar represents an aromatic group; n represents an integer of from 1 to 3; m represents an integer of from 2 to 6; p represents 1 or 2; q represents 0 or an integer of from 1 to 4; $R^2$ represents a hydrogen atom or an alkyl group; and r represents 0, 1 or 2; and (C) at least one compound represented by the following formula (II):

$$R^3-\overset{\overset{\displaystyle O}{\|}}{C}-O-R^4 \qquad (II)$$

wherein $R^3$ and $R^4$ are the same or different and each represents an alkyl group having from 3 to 6 carbon atoms; the proportions of components (A), (B), and (C) being from 25 to 70% by weight, from 20 to 50% by weight, and from 0.001 to 40% by weight, respectively, each based on the sum of components (A), (B), and (C).

7 Claims, No Drawings

DEVELOPING SOLUTION COMPRISING AN AROMATIC HYDROCARBON, AN ALCOHOL, AND AN ESTER

FIELD OF THE INVENTION

This invention relates to a developing solution to be used for formation of a relief comprising a photosensitive resin composition, and more particularly to a developing solution suitable for making a flexographic printing plate having excellent dimensional stability and resolution irrespective of its thickness.

BACKGROUND OF THE INVENTION

Known photosensitive resin compositions for flexographic printing plate include compositions comprising a thermoplastic elastomer, a photopolymerizable unsaturated monomer, and a photopolymerization initiator, such as those described in JP-B-51-43374 and JP-B-59-22219 (the term "JP-B" as used herein means an "examined Japanese patent publication"). The photosensitive resin composition is exposed to active light rays through a mask having a prescribed pattern, and the unexposed area is washed away with a developing solution. Since the photosensitive layer comprises, for example, a hydrophilic thermoplastic elastomer, the photosensitive resin layer does not dissolve in water or an aqueous solvent so that chlorine organic solvents, such as chloroform, trichloroethane, trichloroethylene, and tetrachloroethylene, have been used as a developing solution.

Although the chlorine organic solvents are stable and easy to handle on account of their nonflammability, they not only involve health problems because of their high toxicity but also form one of the causes of destruction of the ozonosphere and are therefore unfavorable from the standpoint of working environment and environmental protection such as air pollution. For these reasons, it has been demanded to develop a nonchlorine developing solution. To this effect, a developing solution comprising an aromatic hydrocarbon and a paraffin or naphthene hydrocarbon at a specific volume ratio (see JP-A-5-322416, the term "JP-A" as used herein means an "unexamined published Japanese patent application") and an organic solvent system comprising a specific ester and an alcohol at a specific volume ratio (see JP-A-4-18564) have been proposed.

The developing solutions according to JP-A-5-134425 are less causative of health and environmental problems than the conventional chlorine organic solvents. However, besides giving off an unpleasant smell, they tend to swell the image area during the development, resulting in a failure of obtaining good image reproduction unless their composition is altered according to the thickness of the plate. Since the developing solution according to JP-A-4-18564 comprises a specific ester, it is expensive and cannot be supplied in large quantity at a low price.

SUMMARY OF THE INVENTION

An object of the present invention is to provide a developing solution for producing a flexographic printing plate, which is free from the disadvantages associated with the conventional developing solutions, i.e., a developing solution which is easy to handle and provides an image area with high resolution (e.g., free from missing of fine lines, small points, small types) and high dimensional stability irrespective of the thickness of the plate.

As a result of extensive studies, the inventors have now found that this and other objects of the present invention are accomplished by a developing solution comprising a specific aromatic hydrocarbon, an alcohol, and a compound represented by formula (II) shown below in a specific volume ratio and thus completed the present invention.

The present invention provides a developing solution comprising (A) at least one aromatic hydrocarbon having a boiling point of from 150° to 300° C.;

(B) at least one alcohol represented by the following formula (I):

$$R^1OH \qquad (I)$$

wherein $R^1$ represents an aliphatic or alicyclic alkyl group having from 5 to 12 carbon atoms, $-C_nH_{2n}Ar$, $-(C_mH_{2m}O)_pC_qH_{2q+1}$, a furfuryl group or a hydrogenated furfuryl group, an alkyl group substituted by an acyl group or an epoxy group, or $-CH_2CH_2(OCH_2CH_2)_rOR^2$; in which Ar represents an aromatic group; n represents an integer of from 1 to 3; m represents an integer of from 2 to 6; p represents 1 or 2; q represents 0 or an integer of from 1 to 4; $R^2$ represents a hydrogen atom or an alkyl group; and r represents 0, 1 or 2; and (C) at least one compound represented by the following formula (II):

$$R^3-\overset{\overset{\displaystyle O}{\|}}{C}-O-R^4 \qquad (II)$$

wherein $R^3$ and $R^4$ are the same or different and each represents an alkyl group having from 3 to 6 carbon atoms; the proportions of components (A), (B), and (C) being from 25 to 70% by weight, from 20 to 50% by weight, and from 0.001 to 40% by weight, respectively, each based on the sum of components (A), (B), and (C).

Further, the present invention provides a process for producing a flexographic printing plate comprising the step of washing away a photosensitive resin composition with the above-described developing solution.

DETAILED DESCRIPTION OF THE INVENTION

The photosensitive resin composition to which the present invention applies mainly comprises a thermoplastic elastomer, a photopolymerizable unsaturated monomer, and a photopolymerization initiator.

The thermoplastic elastomer is a high polymer (high molecular compound) which assumes rubber-like elasticity like vulcanized rubber at ambient temperature and exhibits thermoplasticity at high temperatures. Examples of the thermoplastic elastomers include styrene elastomers, olefin elastomers, polyester elastomers, polyurethane elastomers, 1,2-polybutadiene elastomers, vinyl chloride elastomers, and polyamide elastomers. Preferred of them are styrene-based thermoplastic elastomers, such as a styrene-butadiene-styrene block copolymer, a styrene-isoprene-styrene block copolymer, and hydrogenation products thereof. The thermoplastic elastomer is used in an amount of from 30 to 95% by weight, preferably from 50 to 85% by weight, based on the photosensitive resin composition. When the proportion of the thermoplastic elastomer is less than 30% by weight, the composition has insufficient rubber-like elasticity. When it exceeds 95% by weight, high reproducibility in pattern formation is hardly obtained.

The photopolymerizable unsaturated monomer is a compound having at least one addition polymerizable unsaturated bond in the molecule thereof and is not particularly limited as long as it is compatible with the above-mentioned thermoplastic elastomer. Examples of usable photopolymerizable unsaturated monomers include acrylic esters, acrylamide and its derivatives, methacrylic esters, methacrylamide and its derivatives, allyl compounds, vinyl ethers, vinyl esters, styrene and its derivatives, and crotonic esters. Alcohols which can be used in the preparation of the ester monomers just referred to include aliphatic or alicyclic diols having from 2 to 10, and preferably from 2 to 6, carbon atoms, such as ethylene glycol, triethylene glycol, hexanediol, and cyclohexanediol. These photopolymerizable unsaturated monomers may be used either individually or in combination of two or more thereof. The photopolymerizable unsaturated monomers are used in an amount of from 3 to 80 parts by weight, preferably from 5 to 20 parts by weight, per 100 parts by weight of the thermoplastic elastomer. When the proportion of the monomers is less than 3 parts by weight, high reproducibility in pattern formation is hardly obtained. When it exceeds 80 parts by weight, satisfactory rubber-like elasticity cannot be obtained.

The photopolymerization initiator is arbitrarily selected from commonly employed ones. Benzoin photopolymerization initiators, benzophenone photopolymerization initiators and anthraquinone photopolymerization initiators are preferred. The photopolymerization initiators may be used either individually or in combination of two or more thereof. The initiators are used in an amount of from 0.1 to 5 parts by weight, preferably from 0.5 to 2 parts by weight, per 100 parts by weight of the thermoplastic elastomer. When the proportion of the initiator is less than 0.1 part, practical sensitivity cannot be obtained. When it exceeds 5 parts, a satisfactory pattern cannot be formed.

If desired, the photosensitive resin composition may contain additives for improving various properties, such as dyes, pigments, polymerization inhibitors, antioxidants, and light deterioration inhibitors. In order to improve abrasion resistance, the composition may further contain other resins compatible with the thermoplastic elastomer, such as polyamide resins, epoxy resins, and polyurethane resins.

The photosensitive resin layer for flexographic printing plate production is formed by a known method. For example, a thermoplastic elastomer, a photopolymerizable unsaturated monomer, a photopolymerization initiator and other necessary additives are dissolved in an appropriate organic solvent to prepare a coating composition, the coating composition is shaped into a film or a plate, and the solvent is removed. Alternatively, the above components are mixed in a roll mixer and molded into a film or a plate by means of a hot press.

The photosensitive resin layer preferably has a thickness of from 1 to 8 mm. When it is used for a corrugated fiberboard, the thickness thereof is preferably from 4 to 8 mm. When it is used for other materials, the thickness thereof is preferably from 1 to 4 mm.

In order to prevent desensitization by oxygen in air or blocking, a water-soluble or alcohol-soluble resin, such as cellulose derivatives, polyamide resins or polyimide resins, (hereinafter referred to as an anti-tack resin) is applied on the photosensitive resin layer to form an anti-tack resin layer having a thickness of from 1 to 10 μm.

The photosensitive resin layer is press bonded to a plate such as a polyester sheet, a steel plate and an aluminum plate, and imagewise exposed to active light rays through a mask. The unexposed area is then removed usually by brushing in a developing solution or by applying a spray of a developing solution to obtain a rubbery relief plate for flexographic printing.

The developing solution according to the present invention is a mixture comprising the above-described components (A), (B), and (C).

The aromatic hydrocarbon as component (A) has a property of easily dissolving or swelling the photosensitive resin layer. Component (A) is used in a proportion of from 25 to 70% by weight, preferably from 40 to 60% by weight. When the proportion of component (A) is less than 25% by weight, the rate of development becomes low, and washing away of the photosensitive resin layer takes time. When it exceeds 70% by weight, the developing solution excessively swells the photosensitive resin layer and is incapable of dissolving the anti-tack resin layer. From the viewpoint of non-flammability and ease of drying, the aromatic hydrocarbon as component (A) should have a boiling point of from 150° to 300° C., preferably from 180° to 250° C. Those having a boiling point of lower than 150° C. considerably vaporize into easily ignitable vapors in the air. Those having a boiling point exceeding 300° C. are less vaporizable and less ignitable and therefore less dangerous but need an unfavorably prolonged drying time.

Specific examples of the aromatic hydrocarbons suitable as component (A) include diethylbenzene, propylbenzene, isopropylbenzene, amylbenzene, diamylbenzene, amyltoluene, cymene, and a mixture thereof (e.g., crude oil, naphtha obtained by dry distillation of coal). These aromatic hydrocarbons may be used either individually or in combination of two or more thereof. The mixture of aromatic hydrocarbons noted above are commercially available under trade names of Solvesso 100, Solvesso 150 and Solvesso 200 (products of Exxon Chemical Japan Limited) and Swazol 100, Swazol 200, Swazol 310, Swazol 1000, Swazol 1500 and Swazol 1800 (products of Maruzen Petrochemical Company Limited). Component (A) may contain one or more additives such as benzene, toluene, xylene, ethylbenzene, triamylbenzene, tetraamylbenzene, dodecylbenzene and didodecylbenzene to such a degree that does not lower the ignition point. The components of the above-described mixtures of aromatic hydrocarbons are shown in Table 1 below.

TABLE 1

| Trade Name | Components | Boiling Point (°C.) |
|---|---|---|
| Solvesso 100 | Methylethylbenzene, Trimethylbenzene, Diethylbenzene, Dimethylethylbenzene | 164–176 |
| Solvesso 150 | Unknown | 188–209 |
| Solvesso 200 | Methylnaphthalene, Dimethylnaphthalene, Diphenylnaphthalene, $C_{11}$ aromatics | 231–275 |
| Swazol 100 | Octane, Nonane, Toluene | 103–124 |
| Swazol 200 | Nonane, Alkane(C = 10–29), | 131–150 |
| Swazol 310 | Alkane(C = 10–29), Tri- or tetramethylbenzene, Alkyl(C = 2–4)toluene Branched alkyl(C = 3–36)benzene | 153.5–179 |
| Swazol 1000 | Tri- or tetramethylbenzene, Alkyl(C = 2–4)toluene, Branched alkyl(C = 3–36)benzene | 161–179 |
| Swazol 1500 | Tri- or tetramethylbenzene, Cymene, Diethylbenzene, Naphthalene | 180.5–208.5 |

TABLE 1-continued

| Trade Name | Components | Boiling Point (°C.) |
| --- | --- | --- |
| Swazol 1800 | Diethylbenzene, Branched alkyl(C = 3–36)benzene, Mono- and dimethylnaphthalene, Naphthalene | 195.5–245 |

*Note: C means a carbon number.

The alcohol as component (B) is capable of dissolving an anti-tack resin layerland hardly capable or incapable of dissolving a photosensitive resin layer, rather acting against swelling of the photosensitive resin layer with component (A). Component (B) is used in a proportion of from 20 to 50% by weight, preferably from 30 to 40% by weight. When the proportion of component (B) is less than 20% by weight, the developing solution is incapable of dissolving an anti-tack resin layer. When it exceeds 50% by weight, the developing solution exerts excessive inhibitory action on swelling and needs much time for development.

In formula (I), the aliphatic alkyl group represented by $R^1$ may have a straight-chain or branched structure. The alkyl moiety of the alicyclic alkyl group represented by $R^1$ may also have a straight-chain or branched structure.

Examples of the alcohol represented by formula (I), wherein $R^1$ is an aliphatic or alicyclic alkyl group, include n-amyl alcohol, isoamyl alcohol, sec-amyl alcohol, 3-pentanol, tert-amyl alcohol, hexanol, 2-ethylhexanol, methylamyl alcohol, 2-ethylbutanol, 2-heptanol, 3-heptanol, n-octanol, 2-octanol, 2-ethylhexanol, 3,5,5-trimethylhexanol, nonanol, decanol, undecanol, dodecanol, cyclohexanol and methylcyclohexanol.

Examples of the alcohol represented by formula (I), wherein $R^1$ is $-C_nH_{2n}$-Ar (wherein Ar is an aromatic group; and n is 1 to 3), include 2-phenylethanol and benzyl alcohol.

When $R^1$ in formula (I) is $-(C_mH_{2m}O)_pC_qH_{2q+1}$ (wherein m is 2 to 6; p is 1 or 2; and q is 0 to 4), the alkylene moiety $-C_mH_{2m}-$ and the alkyl moiety $-C_qH_{2q+1}$ may have a straight-chain, branched or cyclic structure. Examples of the alcohol represented by formula (I), wherein $R^1$ is $-(C_mH_{2m}O)_pC_qH_{2q+1}$, include 3-methoxybutanol, 2-butoxyethanol, 3-methoxy-3-methylbutanol and 4-(4'-methoxybutoxy)butanol.

Examples of the alcohol represented by formula (I), wherein $R^1$ is a furfuryl group or a hydrogenated furfuryl group, include furfuryl alcohol and tetrahydrofurfuryl alcohol.

Examples of the alcohol represented by formula (I), wherein $R^1$ is an alkyl group substituted by an acyl group or an epoxy group, include diacetone. alcohol and glycidol.

Examples of the alcohol represented by formula (I), wherein $R^1$ is $-CH_2CH_2(OCH_2CH_2)_rOR^2$ (wherein $R^2$ represents a hydrogen atom or an alkyl group; and r is 0, 1 or 2), include ethylene glycol and monoalkyl ethers thereof, diethylene glycol and monoalkyl ethers thereof, and triethylene glycol and monoalkyl ethers thereof.

Among these alcohols, preferred is 3-methoxy-3-methylbutanol.

The compound represented by formula (II) as component (C) has an aroma and is capable of mildly removing the unexposed area of a photosensitive resin layer. Accordingly, component (C) controls the swelling action of component (A) on the exposed area without reducing the developing ability of the developing solution and thereby contributes to high resolution such as development of fine lines, small points and small types. Additionally, component (C) disguises the unpleasant smell of component (A). Component (C) is used in a proportion of from 0.001 to 40% by weight, preferably from 0.1 to 25% by weight. When the proportion of component (C) is less than 0.001%, no effect on swelling control or smell control is produced. When it exceeds 40%, the excessive inhibitory effect on swelling is exerted to retard the development. As a result, the exposed area cannot be prevented from being swollen with component (A). Such a high proportion is also uneconomical.

In formula (II), the alkyl groups represented by $R^3$ and $R^4$ may have a straight-chain, branched or cyclic structure. Of the compounds represented by formula (II), the compounds, wherein at least one of $R^3$ and $R^4$ is a branched alkyl group, are preferred for their great effect on inhibition of swelling. Examples of such compounds include n-butyl isobutyrate, isobutyl n-butyrate, isobutyl isobutyrate, isobutyl 2-methylbutyrate, and isobutyl 3-methylbutyrate, with isobutyl isobutyrate being more preferred.

The developing solution according to the present invention may contain one or more additives such as solvents in an amount of from 0 to 35% by weight based on the total weight of the developing solution, as component (D). Examples of the solvents include naphthene hydrocarbons and paraffin hydrocarbons.

The developing solution according to the present invention exhibits the action of inhibiting swelling and the action of masking the unpleasant smell of an aromatic hydrocarbon, which are attributed to component (C), and the action of controlling swelling, which is attributed to component (B), in good balance. Thus, the developing solution achieves development at a high resolution while inhibiting the swelling of the exposed area to provide a flexographic printing plate with high line width accuracy irrespective of the thickness of the plate. Containing no chlorine component, the developing solution favors environmental sanitation and protection. Having a high boiling point, the developing solution has a high ignition point and is very safe on use.

The present invention will now be illustrated in greater detail by way of the following examples, but it should be understood that the present invention is not to be construed as being limited thereto. All the percents and parts are by weight unless otherwise indicated.

EXAMPLE 1

In 200 parts of methyl ethyl ketone were dissolved 100 parts of a styrene-butadiene-styrene block copolymer (TRKX65S, a product of Shell Kagaku K.K.; weight average molecular weight: 130,000; styrene unit content: 28%), 60 parts of liquid polybutadiene (NISSO-PB B-1000, a product of Nippon Soda Co., Ltd.; weight average molecular weight: 1050; 1,2-vinyl content: 85% or more), 6 parts of trimethylolpropane triacrylate, 2 parts of benzyl dimethyl ketal, and 0.012 part of 2,6-di-tert-butyl-p-cresol in a flask while stirring under reflux for about 2 hours. The resulting photosensitive resin composition was applied to a 100 μm thick polyethylene terephthalate (PET) film (substrate) having thereon an adhesive layer to obtain a photosensitive resin plate having a dry photosensitive resin layer thickness of 2.74 mm and dried at 60° C. for 12 hours.

Separately, a composition consisting of 100 g of methanol and 5 g of an alcohol-soluble polyamide (Macromelt 6900, a product of Henckel Corporation) was applied to a 100 μm thick PET film as a temporary substrate and dried at 60° C. for 2 minutes to form a polyamide coated layer (an anti-tack resin layer) having a thickness of 5 µm. The polyamide coated layer was adhered to the above-prepared photosensitive resin layer via an adhesive.

Active light rays of a chemical lamp (FL-40BL manufactured by Toshiba Corporation) was applied to the entire surface from the substrate side for 2 minutes. The PET film of the polyamide coated layer side was stripped off, and a negative film having a parallel line pattern having a line width of 0.1 mm was brought into contact with the photosensitive resin layer under reduced pressure. The photosensitive resin layer was selectively irradiated with active light rays for 15 minutes using the same chemical lamp.

A developing solution was prepared from 4 kg of Solvesso 150 (an aromatic hydrocarbon solvent produced by Exxon Chemical Japan Limited; boiling point (b.p.): 188°–209° C.), 3.25 kg of benzyl alcohol, and 0.75 kg of isobutyl isobutyrate. The unexposed area of the photosensitive resin layer were removed with the developing solution in a brush developing machine at 25° C. for 2 minutes. After drying at 50° C. for 30 minutes, the entire surface of the plate was irradiated using the same chemical lamp for 15 minutes to obtain a flexographic printing plate, in which the line width of 0.1 mm was accurately reproduced.

EXAMPLE 2

A flexographic printing plate was prepared in the same manner as in Example 1, except for using a developing solution consisting of 4.8 kg of Swazol 1500 (an aromatic hydrocarbon solvent produced by Maruzen Petrochemical Company Limited; b.p.: 180.5°–208.5° C.), 3.184 kg of benzyl alcohol, and 0.016 kg of isobutyl isobutyrate. The developing solution gave off a reduced petroleum smell of Swazol. The line width of 0.1 mm was accurately reproduced in the resulting flexographic printing plate.

COMPARATIVE EXAMPLE 1

A flexographic printing plate was prepared in the same manner as in Example 2, except for using a developing solution consisting of 6 kg of Swazol 1500 and 4 kg of benzyl alcohol. The smell of the developing solution was too strong for the worker to continue development processing for a long time. The resulting flexographic printing plate suffered from partial waviness of the line pattern.

COMPARATIVE EXAMPLE 2

A flexographic printing plate was prepared in the same manner as in Example 2, except for using a developing solution consisting of 6 kg of Swazol 1500 and 2 kg of isobutyl isobutyrate. The anti-tack resin layer of the flexographic printing plate was not completely removed, resulting in uneven development.

COMPARATIVE EXAMPLE 3

A flexographic printing plate was prepared in the same manner as in Example 2, except for using a developing solution consisting of 1.6 kg of Swazol 1500, 2.4 kg of benzyl alcohol, and 4 kg of isobutyl isobutyrate. Two minutes' development processing was insufficient for reproduction of the pattern so that the processing was further continued for an additional period of 1 minute. The resulting flexographic printing plate suffered from partial waviness of the line pattern.

EXAMPLE 3

The same photosensitive resin composition as prepared in Example 1 was applied to each of a PET film having thereon an adhesive layer (substrate) and a PET film with no adhesive, both having a thickness of 100 µm, to a dry thickness of 3.0 mm and 3.25 mm, respectively, and dried at 60° C. for 1 hour. The two coated films were laminated with their photosensitive resin layers facing to each other, and the laminate was further dried at 60° C. for 1 hour. The PET film with no adhesive was stripped off, an adhesive was applied to the thus exposed photosensitive resin layer, and the same polyamide coated resin layer formed on a 100 µm thick PET film as prepared in Example 1 was laminated thereon to obtain a photosensitive resin plate having a dry photosensitive resin layer thickness of 6.25 mm.

Active light rays of a chemical lamp (FL-40BL) was applied to the entire surface of the laminate from the substrate side for 4 minutes. The PET film of the polyamide coated layer side was stripped off, and a negative film having a parallel line pattern having a line width of 0.2 mm was brought into contact with the photosensitive resin layer under reduced pressure. The photosensitive resin layer was selectively irradiated with active light rays for 15 minutes using the same chemical lamp through the negative film.

The unexposed area of the photosensitive resin layer were removed with the same developing solution as prepared in Example 1 at 25° C. for 5 minutes. After drying at 50° C. for 40 minutes, the entire surface of the plate was irradiated using the same chemical lamp to obtain a flexographic printing plate, in which the relief depth was 2.5 mm and the line width of 0.2 mm was accurately reproduced.

EXAMPLE 4

A photosensitive resin plate was prepared in the same manner as in Example 1, except for increasing the thickness of the photosensitive resin layer to 6.25 mm. After imagewise exposure in the same manner as in Example 3, the photosensitive resin layer was developed with the same developing solution as used in Example 2 at 25° C. for 5 minutes, dried at 50° C. for 40 minutes, and irradiated overall with light using the same chemical lamp as used in the foregoing Examples. The line width of 0.2 mm was accurately reproduced in the resulting flexographic printing plate.

COMPARATIVE EXAMPLE 4

A flexographic printing plate was prepared in the same manner as in Example 4, except for using the same developing solution as used in Comparative Example 1. The resulting flexographic printing plate gave off a petroleum smell and suffered from partial waviness of the 0.2 mm wide lines.

COMPARATIVE EXAMPLE 5

A flexographic printing plate was prepared in the same manner as in Example 4, except for using the same developing solution as used in Comparative Example 2. The anti-tack resin layer of the flexographic printing plate was not completely removed for 5 minutes' development processing, and for further 3 minutes' development processing.

COMPARATIVE EXAMPLE 6

A flexographic printing plate was prepared in the same manner as in Example 4, except for using the same developing solution as used in Comparative Example 3. Seven minutes' development processing was required for obtaining the relief depth of 2.5 mm, and the 0.2 mm wide lines have a partial waviness.

EXAMPLE 5

A flexographic printing plate was prepared in the same manner as in Example 1, except for using a developing solution consisting of 3.2 kg of Solvesso 150, 1.8 kg of 3-methoxy-3-methylbutanol, 0.4 kg of isobutyl isobutyrate and 2.6 kg of Naphthezole L (a naphthalene solvent manufactured by Nippon Petrochemicals Co., Ltd.; b.p.:177°–200° C.). The line width of 0.1 mm was accurately reproduced in the resulting flexographic printing plate.

The results obtained in Examples 1 to 5 and Comparative Examples 1 to 6 are shown in Table 1 below.

In Table 1, "good" in "reproducibility of line image" means that, when the plate has a thickness of 2.84 mm, the line width of 0.1 mm was accurately reproduced, and that, when the plate has a thickness of 6.35 mm, the line width of 0.2 mm was accurately reproduced. "poor" therein means that they were not achieved.

"good" in "developing time" means that, when the plate has a thickness of 2.84 mm, development was achieved within 2 minutes, and that, when the plate has a thickness of 6.25 mm, development was achieved within 5 minutes. "poor" therein means that they were not achieved within 2 and 5 minutes, respectively.

A developing solution which had a weak smell and completely dissolved the anti-tack resin layer and the unexposed area of the photosensitive resin layer within prescribed minutes to provide a flexographic printing plate on which a line pattern was accurately reproduced was rated "good". When not, the developing solution was rated "poor".

a flexographic printing plate having excellent resolution and dimensional Stability irrespective of the plate thickness.

While the invention has been described in detail and with reference to specific examples thereof, it will be apparent to one skilled in the art that various changes and modifications can be made therein without departing from the spirit and scope thereof.

What is claimed is:

1. A developing solution consisting essentially of:
   (A) at least one aromatic hydrocarbon having a boiling point of from 150° to 300° C.;
   (B) at least one alcohol represented by the following formula (I):

$$R^1OH \qquad (I)$$

wherein $R^1$ represents an aliphatic or alicyclic alkyl group having from 5 to 12 carbon atoms, $-C_nH_{2n}Ar$, $-(C_mH_{2m}O)_pC_qH_{2q+1}$, a furfuryl group or a hydrogenated furfuryl group, an alkyl group substituted by an acyl group or an epoxy group, or $-CH_2CH_2(OCH_2CH_2)_rOR^2$; in which Ar represents an aromatic group; n represents an integer of from 1 to 3; m represents an integer of from 2 to 6; p represents 1 or 2; q represents 0 or an integer of from 1 to 4; $R^2$ represents a hydrogen atom or an alkyl group; and r represents 0, 1 or 2; and
   (C) isobutyl isobutyrate the proportions of components (A), (B), and (C) being from 25 to 70% by weight, from 20 to 50% by weight, and from 0.001 to 40% by weight, respectively, each based on the sum of components (A), (B), and (C).

2. The developing solution as claimed in claim 1, wherein the aromatic hydrocarbon is selected from the group consisting of diethylbenzene, propylbenzene, isopropylbenzene,

TABLE 2

| Example No. | Composition of Developing Solution | | | | Plate Thickness* (mm) | Smell | Dissolving Power for Anti-tack Resin Layer | Reproducibility of Line Image | Developing Time | Total Judgement |
|---|---|---|---|---|---|---|---|---|---|---|
| | (A) (wt %) | (B) (wt %) | (C) (wt %) | (D) (wt %) | | | | | | |
| Example 1 | 50 | 40.6 | 9.4 | — | 2.84 | weak | good | good | good | good |
| Example 2 | 60 | 39.8 | 0.2 | — | 2.84 | weak | good | good | good | good |
| Comparative Example 1 | 60 | 40 | — | — | 2.84 | strong | good | poor | good | poor |
| Comparative Example 2 | 75 | — | 25 | — | 2.84 | weak | poor | poor | poor | poor |
| Comparative Example 3 | 20 | 30 | 50 | — | 2.84 | weak | good | poor | poor | poor |
| Example 3 | 50 | 40.6 | 9.4 | — | 6.35 | weak | good | good | good | good |
| Example 4 | 60 | 39.8 | 0.2 | — | 6.35 | weak | good | good | good | good |
| Comparative Example 4 | 60 | 40 | — | — | 6.35 | strong | good | poor | good | poor |
| Comparative Example 5 | 75 | — | 25 | — | 6.35 | weak | poor | poor | poor | poor |
| Comparative Example 6 | 20 | 30 | 50 | — | 6.35 | weak | good | poor | poor | poor |
| Example 5 | 40 | 22 | 5 | 33 | 2.84 | weak | good | good | good | good |

Note: *Inclusive of the thickness of the substrate.

As is apparent from the results in Table 2, the developing solution according to the present invention has a weak smell and exhibits excellent performance in removal of an anti-tack resin layer and development of a photosensitive resin layer to achieve high resolution. The present invention thus makes it possible to produce, in a reduced developing time, amylbenzene,0 diamylbenzene, amyltoluene, cymene and a mixture thereof.

3. The developing solution as claimed in claim 1, wherein the alcohol is selected from the group consisting of n-amyl alcohol, isoamyl alcohol, sec-amyl alcohol, 3-pentanol, tert-amyl alcohol, hexanol, 2-ethylhexanol, methylamyl alcohol, 2-ethylbutanol, 2-heptanol, 3-heptanol, n-octanol, 2-octanol, 2-ethylhexanol, 3,5,5-trimethylhexanol, nonanol, decanol, undecanol, dodecanol, cyclohexanol, methylcyclohexanol, 2-phenylethanol, benzyl alcohol, 3-methoxybutanol, 2-butoxyethanol, 3-methoxy-3-methylbutanol, 4-(4'-methoxybutoxy)butanol, furfuryl alcohol, tetrahydrofurfuryl alcohol, diacetone alcohol, glycidol, ethylene glycol and monoalkyl ethers thereof, diethylene glycol and monoalkyl ether thereof, and triethylene glycol and monoalkyl ethers thereof.

4. The developing solution as claimed in claim 1, wherein component (A) is used in a proportion of from 40 to 60% by weight based on the sum of components (A), (B), and (C).

5. The developing solution as claimed in claim 1, wherein component (B) is used in a proportion of from 30 to 40% by weight based on the sum of components (A), (B), and (C).

6. The developing solution as claimed in claim 1, wherein component (C) is used in a proportion of from 0.1 to 25% by weight based on the sum of components (A), (B), and (C).

7. A developing solution consisting essentially of:

(A) at least one aromatic hydrocarbon having a boiling point of from 150° to 300° C.;

(B) at least one alcohol represented by the following formula (I):

$$R^1OH$$

wherein $R^1$ represents an aliphatic or alicyclic alkyl group having from 5 to 12 carbon atoms, $-C_nH_{2n}Ar$, $-(C_mH_{2m}O)_pC_qH_{2q+1}$, a furfuryl group or a hydrogenated furfuryl group, an alkyl group substituted by an acyl group or an epoxy group, or $-CH_2CH_2(OCH_2CH_2)_rOR^2$; in which Ar represents an aromatic group; n represents an integer of from 1 to 3; m represents an integer of from 2 to 6; e represents 1 or 2; q represents 0 or an integer of from 1 to 4; $R^2$ represents a hydrogen atom or an alkyl group; and r represents 0, 1, or 2;

(C) isobutyl isobutyrate; the proportions of components (A), (B), and (C) being from 25 to 70% by weight, from 20 to 50% by weight, and from 0.001 to 40% by weight, respectively, each based on the sum of components (A), (B), and (C); and (D) at least one of napthene hydrocarbons and paraffin hydrocarbons which is present in an amount up to 35% by weight based on the total weight of the developing solution.

\* \* \* \* \*